United States Patent
Jones et al.

(10) Patent No.: US 6,497,784 B1
(45) Date of Patent: Dec. 24, 2002

(54) SEMICONDUCTOR WAFER EDGE BEAD REMOVAL METHOD AND TOOL

(75) Inventors: Bradley P. Jones, Wappingers Falls, NY (US); Viraj Y. Sardesai, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/441,862

(22) Filed: Nov. 17, 1999

Related U.S. Application Data

(62) Division of application No. 09/021,762, filed on Feb. 11, 1998, now Pat. No. 6,117,778.

(51) Int. Cl.$^7$ .............................................. H01L 21/00
(52) U.S. Cl. ................................................. 156/345.12
(58) Field of Search ........................ 156/345; 118/715, 118/730

(56) References Cited

U.S. PATENT DOCUMENTS

| | | | |
|---|---|---|---|
| 4,510,176 A | * 4/1985 | Cuthbert et al. | ............ 438/780 |
| 4,668,334 A | * 5/1987 | Doornveld | .................. 438/695 |
| 4,968,375 A | 11/1990 | Sato et al. | |
| 5,075,256 A | 12/1991 | Wang et al. | |
| 5,084,071 A | * 1/1992 | Nenadic et al. | ............... 51/309 |
| 5,213,650 A | 5/1993 | Wang et al. | |
| 5,378,511 A | * 1/1995 | Cardinali et al. | |
| 5,494,849 A | 2/1996 | Iyer et al. | |
| 5,554,256 A | 9/1996 | Pruijmboom et al. | |
| 5,599,423 A | * 2/1997 | Parker et al. | ............... 438/692 |
| 5,618,227 A | * 4/1997 | Tsutsumi et al. | ........... 451/288 |
| 5,692,947 A | * 12/1997 | Talieh et al. | ................... 451/41 |
| 5,722,877 A | * 3/1998 | Meyer et al. | ................... 451/41 |
| 5,738,568 A | * 4/1998 | Jurjevic et al. | ............... 451/41 |
| 5,769,697 A | * 6/1998 | Nishio | ........................ 451/288 |
| 5,863,829 A | 1/1999 | Nakayoshi et al. | |
| 5,879,226 A | 3/1999 | Robinson | |
| 6,190,236 B1 | * 2/2001 | Drill | ............................ 451/41 |
| 6,205,658 B1 | * 3/2001 | Kawano | ...................... 29/852 |

OTHER PUBLICATIONS

Microdevices Physics and Fabrication Technologies, "Semiconductor Lithography Principles, Practices, and Materials", pp. 647–648; 1988.

* cited by examiner

*Primary Examiner*—Gregory Mills
*Assistant Examiner*—Sylvia R. MacArthur
(74) *Attorney, Agent, or Firm*—Jay H. Anderson; James J. Cioffi; Delio & Peterson, LLC

(57) ABSTRACT

A method for planarizing a dielectric layer on a semiconductor wafer is provided. In one aspect, the wafer is coated with a resist and the resist selectively removed forming an uncoated peripheral portion of the wafer. The partially coated wafer is then exposed to an etchant such as RIE to etch the dielectric material not covered by the resist and forming a profiled dielectric layer having a thinner peripheral dielectric portion and a remaining thicker original dielectric central portion. The profiled wafer is then planarized using CMP. The dielectric layer is typically $SiO_2$, PSG, BSP, or BPSG. In another method and apparatus of the invention, a dielectric coated wafer is secured to a rotating turntable and a liquid etchant sprayed at the periphery of the wafer from a distribution conduit to etch and remove dielectric from a circumferential edge of the wafer forming a profiled dielectric layer as above which is then planarized by CMP. In another aspect of the invention, a CMP polished semiconductor wafer having an edge bead is planarized by polishing only the edge bead of the dielectric layer using a special polishing tool or a CMP apparatus to remove the edge bead from the dielectric layer. Planarized semiconductor wafers made using the method and apparatus of the invention are also provided.

3 Claims, 5 Drawing Sheets

SEMICONDUCTOR WAFER EDGE BEAD REMOVAL METHOD AND TOOL

This is a divisional of co-pending application Ser. No. 09/021,762 filed on Feb. 11, 1998, now U.S. Pat. No. 6,117,778.

BACKGROUND OF THE INVENTION

1. Field of the Invention

The present invention relates to processing of semiconductor wafers and other electronic substrates such as slices of semiconductor silicon and other articles requiring a planar surface and, more particularly, to a method and apparatus for planarizing a dielectric layer on a semiconductor wafer by removing an edge bead of the dielectric formed at the periphery of the semiconductor wafer during polishing of the wafer and/or forming a profiled dielectric layer which when planarized using, e.g., chemical mechanical polishing, forms a planar surface.

2. Description of Related Art

In the manufacture of integrated circuits, wafer surface planarity is of extreme importance. Photolithographic processes are typically pushed close to the limit of resolution and it is essential that the wafer surface be highly planar so that the electromagnetic or other radiation used to create the integrated circuit may be accurately focused in a single level thus resulting in precise imagining over the entire surface of the wafer. Wavy, curved or wedge-shaped semiconductor disks result in lack of definition when, for example, a photosensitive resist is applied to the surface of the disk and exposed.

One of the fabrication steps in the manufacture of integrated circuit devices is to apply a layer of dielectric to the wafer as a dielectric layer or interlayer. The dielectric layer is typically a glass such as $SiO_2$ and doped glasses such as PSG, BSP, BPSG and the like. The dielectric layers are sometimes annealed to reflow the deposited dielectric and planarize the dielectric layer. Unfortunately, this procedure is not sufficient to produce ultra high density integrated circuits and additional steps are typically required to further planarize the surface.

Such a further processing step is the chemical-mechanical planarization process (CMP) which involves pressing a semiconductor wafer or other such electronic component or other substrate against a moving polishing surface that is wetted with a chemical reactive, abrasive slurry. The slurries are usually either basic or acidic and generally contain alumina, silica or other ceramic particles. The polishing surface is typically a planar pad made of a relatively soft, porous (open pored) material such as cast polyurethane. The pad is usually mounted on a rotatable planar platen.

In general, the wafer is secured to a carrier plate (or wafer carrier) by vacuum or by a mounting medium such as an adhesive, with the wafer having a forced load applied thereto through the carrier by a pressure plate so as to press the wafer into frictional contact with a polishing pad mounted on a rotating turntable. The carrier and pressure plate also rotate as a result of either the driving friction from the turn table or rotation drive means directly attached to the pressure plate.

An edge bead or a "lip" of dielectric typically remains on the face of the wafer after CMP. The edge bead is generally a circumferential ring about 2 to 8 mm in width from the edge of the wafer. The edge bead or lip in general gradually increases in thickness toward the wafer edge to about 1000–3000 Å thicker than the dielectric in the central portion of the wafer. As noted above, a thicker dielectric area on portions of the wafer surface may lead to electrical problems such as open contacts and the like. The use of a reactive ion etch (RIE) is typically sufficient to open vias in normal thickness dielectric in the middle of the wafer, but if there is not enough over etch, the RIE will not reach the bottom of the thicker dielectric layer in the edge bead. The edge bead can also prevent focusing by lithography tools at the edge of the semiconductor wafer since the raised area will be out of focus with the lithography tool. Basically, elimination of the edge bead to provide a planar semiconductor surface increases the number of acceptable chips which can be made on each wafer.

Bearing in mind the problems and deficiencies of the prior. art, it is therefore an object of the present invention to provide a method to improve planarity of a dielectric layer on a semiconductor wafer and other such electronic component workpieces which have been planarized using a chemical mechanical planarization or other such process.

It is another object of the present invention to provide an apparatus for the chemical mechanical planarization of the dielectric layer on a semiconductor wafer or other electronic workpieces.

It is an additional object of the present invention to provide a method and apparatus for forming a profiled dielectric layer on a semiconductor wafer which when planarized using CMP or other such process forms a planar dielectric surface.

It is a further object of the present invention to provide flat planar workpieces, including semiconductor wafers, made using the improved method and apparatus of the invention.

Other objects and advantages of the present invention will be readily apparent from the following description.

SUMMARY OF THE INVENTION

The above and other objects and advantages, which will be apparent to one of skill in the art, are achieved in the present invention which is directed, in a first aspect, to a method for planarizing a dielectric layer on a semiconductor wafer or other workpiece comprising the steps of:

applying a resist to a dielectric coated wafer to coat the wafer with a layer of the resist;

removing the resist from a circumferential peripheral portion of the wafer from which the dielectric material is desired to be removed and leaving the resist on a central portion of the wafer;

exposing the partially resist coated wafer to a dry or wet etchant which etches the dielectric layer not covered by the resist;

etching the partially resist coated wafer for an effective etching time until the desired amount of dielectric material is removed from the circumferential peripheral portion forming a profiled dielectric layer having a thinner dielectric peripheral portion than the remaining central dielectric portion of the wafer;

removing the resist from the central portion of the etched wafer; and planarizing the profiled dielectric layer by CMP or other polishing or planarization process.

In another aspect of the invention, the dielectric may be a glass such as SiO, PSG, BSG, BPSG and the like. In a preferred aspect, the dielectric layer is $SiO_2$ and the etchant is a reactive ion etch or wet etch.

In an additional aspect of the invention, a method for planarizing a dielectric layer on a semiconductor wafer is provided comprising the steps of:

securing, to a rotatable turntable, preferably horizontal, a dielectric coated wafer;

rotating the turntable and the dielectric coated wafer;

applying a liquid etchant to a circumferential peripheral portion of the wafer preferably in the form of a spray to remove dielectric material from the circumferential peripheral portion of the wafer;

continuing the spraying until the desired amount of dielectric is removed providing a semiconductor wafer having a profiled dielectric layer wherein the dielectric peripheral portion is thinner than the remaining central dielectric portion of the wafer; and planarizing the profiled dielectric layer by CMP or other polishing process.

In another aspect of the invention, the method comprises using a spray nozzle providing an etchant spray.

In an additional aspect of the invention, the liquid etchant is applied to the wafer by an apparatus comprising a rotating turntable, preferably horizontal, to rotate a wafer thereon and a distribution conduit preferably containing a spray nozzle which conduit moves back and forth over the area to be etched. It is preferred that the outlet of the distribution conduit be positioned less than about 0.5 inch above the surface of the wafer and preferably adjacent the surface. It is also preferred that the flow rate of the spray be about 1 to 100 ml/min.

In a further aspect of the invention, a semiconductor wafer to be planarized is first polished by a CMP process and then the resulting edge bead removed by etching or by further CMP of the wafer on only the edge bead portion of the wafer. These methods are not preferred with profiling of the dielectric layer (thinner peripheral dielectric edge) before CMP being preferred.

In an additional aspect of the invention, a method for planarization of a dielectric layer on a semiconductor wafer comprises the steps of:

planarizing the dielectric surface of the wafer by CMP wherein a polishing pad of the apparatus used for the CMP contacts the dielectric layer; and planarizing the edge bead of the surface of the wafer by polishing the peripheral edge of the surface of the wafer by contacting the peripheral edge of the wafer with the polishing pad of a CMP apparatus so that the peripheral edge of the surface of the wafer contacts the polishing pad.

In a further aspect of the invention, a method for planarizing a dielectric layer on a semiconductor wafer comprises the steps of:

planarizing the dielectric surface of the wafer by CMP and forming a wafer having a peripheral edge bead; and planarizing the peripheral edge of the face of the wafer using a rotating polishing pad having a diameter about the width or less than the width of the edge bead the polishing pad contacting the peripheral edge bead of the surface of the wafer.

It is another aspect of the invention to provide planar workpieces such as semiconductor wafers made using the improved method and apparatus of the invention.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1A:
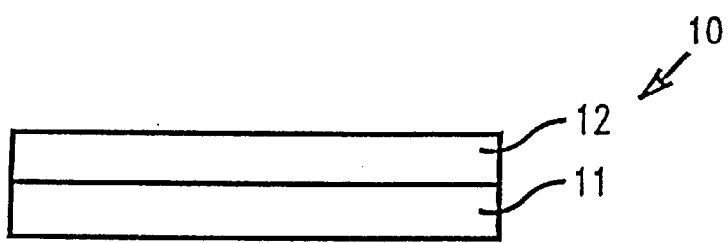
FIGS. 1A–1F show a series of steps to form a profiled dielectric coated semiconductor wafer using a dry or wet etchant such as a reactive ion etch.

In describing the preferred embodiment of the present invention, reference will be made herein to FIGS. 1–6B of the drawings in which like numerals refer to like features of the invention. Features of the invention are not necessarily shown to scale in the drawings.

Referring to FIGS. 1A–1E, a method of the invention is shown to form a profiled dielectric layer from a dielectric coated semiconductor wafer using a resist and an etchant. In FIG. 1A, a semiconductor wafer is shown generally as 10. The wafer has a silicon substrate 11 (the substrate 11 may also be gallium arsenide) having a dielectric layer 12 such as $SiO_2$ on the upper surface thereof. The method also applies to a dielectric which has been planarized using a chemical-mechanical planarization process which formed an edge bead on the dielectric.

Figure 1B:
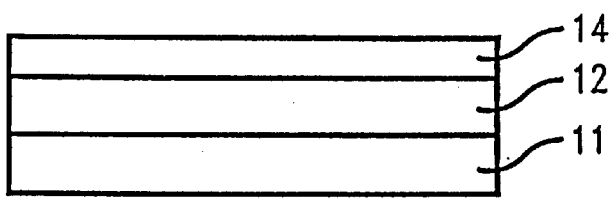
Figure 1C:
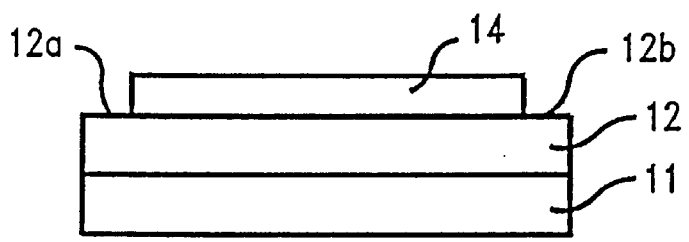

As shown in FIG. 1B, resist layer 14 is applied to the semiconductor wafer 10 of FIG. 1A and coats the dielectric layer 12. The resist layer 14 is exposed and developed to form as shown in FIG. 1C a central resist layer portion overlying the central portion of the wafer exposing peripheral dielectric portions 12a and 12b of dielectric 12. The resist may be any suitable resist such as novolak and substrated polyhydroxystyrene copolymer and is typically applied by spin coating.

Figure 1D:
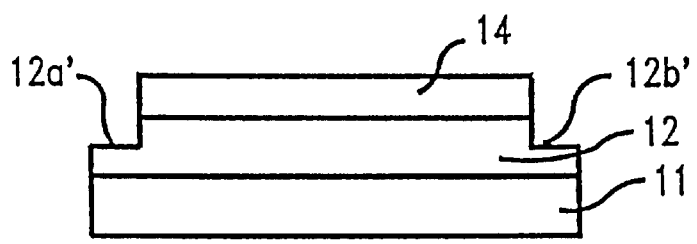
Figure 1E:
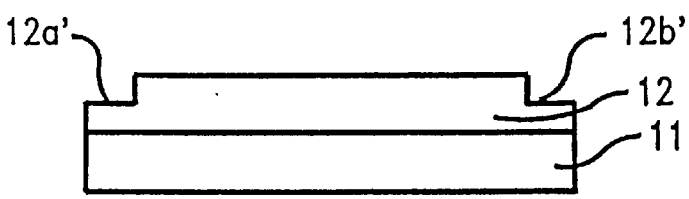
Figure 1F:
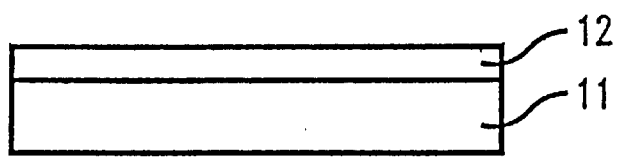

In FIG. 1D a portion of the dielectric portions 12a and 12b are removed leaving thinner dielectric portions 12a' and 12b' at the periphery of the dielectric 12. The resist is now removed leaving profiled dielectric layer 12 having peripheral thinner portions 12a' and 12b' as shown in FIG. 1E. The wafer of FIG. 1E is chemically mechanically planarized using a conventional CMP apparatus forming a planar dielectric coated substrate as shown in FIG. 1F.

Figure 2A:
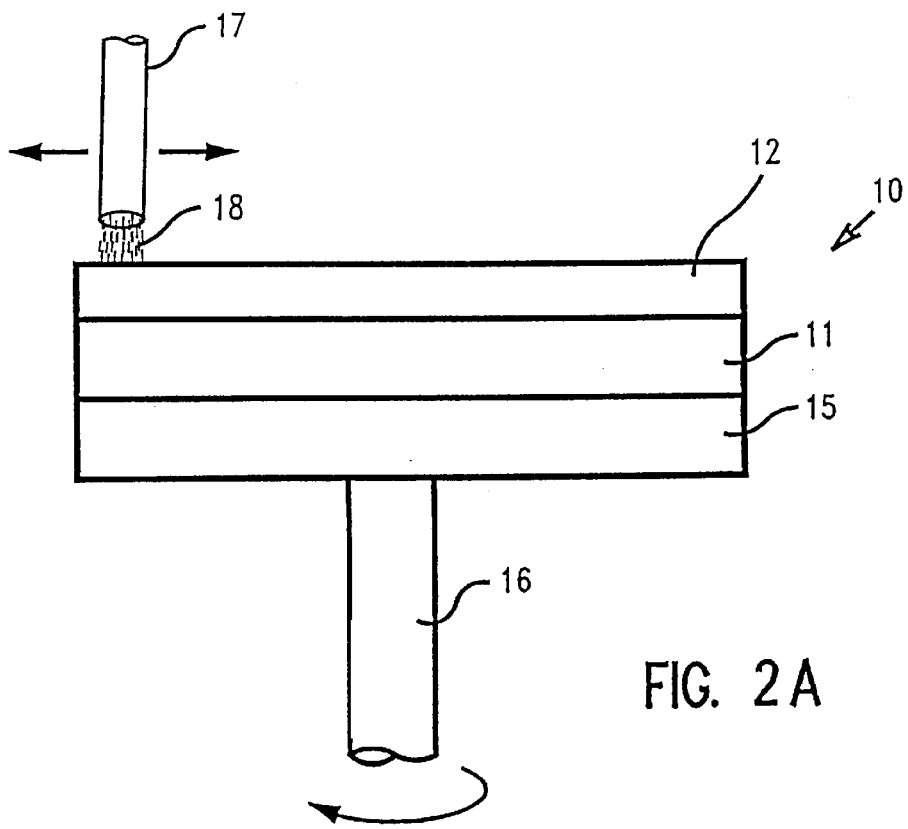
FIGS. 2A–2B show diagramatically an apparatus used to form a profiled dielectric coated semiconductor wafer using is a liquid etchant spray.
Figure 2B:
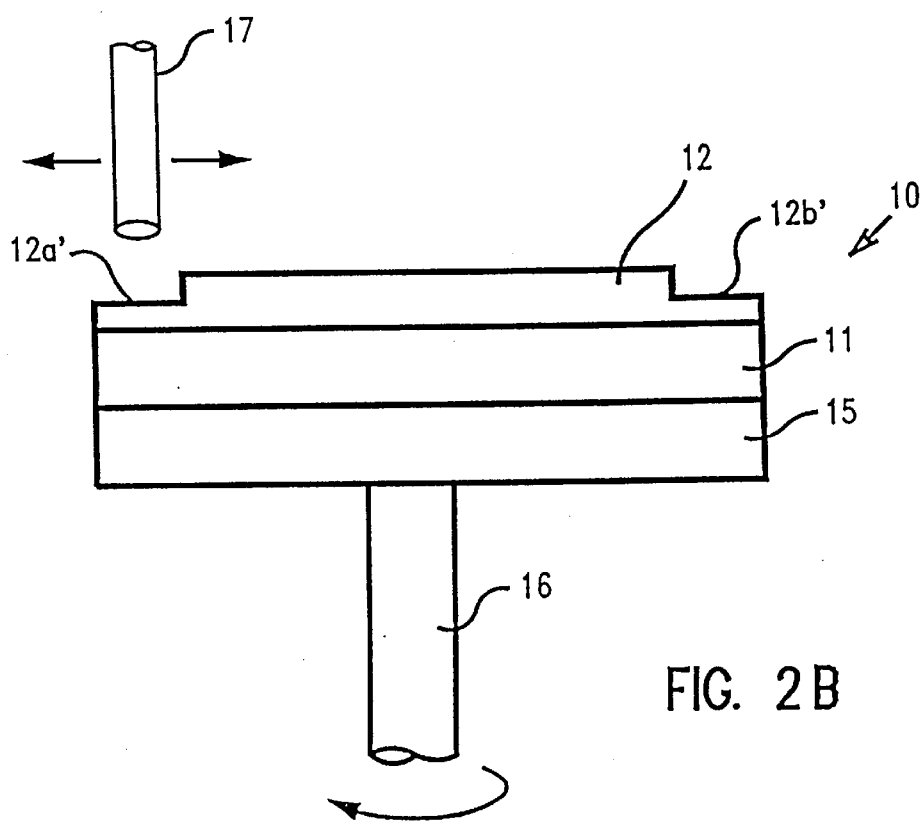

Referring now to FIGS. 2A and 2B, a semiconductor wafer shown generally as 10 comprises a semiconductor substrate 11 having on the surface thereof a dielectric layer 12. The semiconductor wafer 10 is shown positioned on a horizontal turntable 15 which is rotated. by vertical shaft 16 in the direction of the arrow. A distribution conduit 17 comprises typically a tubular member such as a pipe or flexible tubing through which a liquid etchant 18 is delivered to the dielectric surface of the semiconductor wafer. The distribution conduit is shown by the arrows as being moveable laterally back and forth across the surface of the wafer and produces a spray 18 which impinges upon the surface of the dielectric layer 12.

According to the method and apparatus of the invention, the distribution conduit 17 is positioned over the dielectric circumferential edge of the dielectric 12 and moves back and forth over this area and sprays an etchant 18 onto the periphery of the dielectric. The spraying procedure is continued until as shown in FIG. 2B a portion of the dielectric at the periphery is removed forming dielectric surfaces 12a' and 12b'. The profiled semiconductor wafer would then be polished by CMP forming a planar dielectric layer 12 as shown above in FIG. 1F. The method also applies to a dielectric which has been planarized using a chemical-mechanical planarization process and which formed an edged bead on the dielectric.

Any conventional rotating turntable assembly may be used such as the devices used in a CMP process. It is preferred that the distribution conduit 14 be a tubular member having a spray nozzle in the outlet end for spraying the etchant onto the semiconductor wafer surface.

It is an important feature of the invention that the end of the distribution conduit 14 be at a controlled height above the edge layer of the surface to be etched. It is preferred that the end of the conduit be less than about 0.5 inch, preferably adjacent the surface of the dielectric to be etched, e.g., 0.25 inch or less. It is also preferred that a spray nozzle be used to provide a continuous stream or spray. It is also preferred that the spray be applied from a pressurized nozzle at a flow rate of about 1 to 100 ml/min.

The conduit is moved laterally over the surface of the wafer to be etched while the wafer is rotating as shown in FIG. 2A. The wafer is rotated usually at a speed of about 2,000 to 4,000 rpm. Typically, the end of the conduit (and spray) will not extend beyond the outer edge of the wafer nor beyond the inner edge of the edge bead being removed. It is also preferred that the spray be directed substantially transverse to the wafer during the back and forth motion of the distribution conduit across the wafer surface.

A typical liquid etchant is HF (hydrofluoric acid), DHF (dilute hydrofluoric acid) or BHP (buffered hydrofluoric acid) but any suitable etchant may be employed. The etchant may be applied at an ambient temperature, although elevated etchant temperatures may be employed for specific etchant materials and dielectrics.

Once the surface of the dielectric is profiled as shown in FIG. 2B, the etchant flow is stopped and the wafer rinsed and dried by spinning, heat, solvent vaporization, Marangoni effect or air blower. The etched profiled wafer is now ready for further processing operations such as a CMP process to planarize the dielectric surface 12.

The radius (width) of the circumferential peripheral portion etched may be varied during the etchant process and also to etch longer in some areas, to taper the etch and/or to prevent formation of a sharp step between the edge portions and central portions of the wafer as shown in FIG. 2B.

Figure 3A:
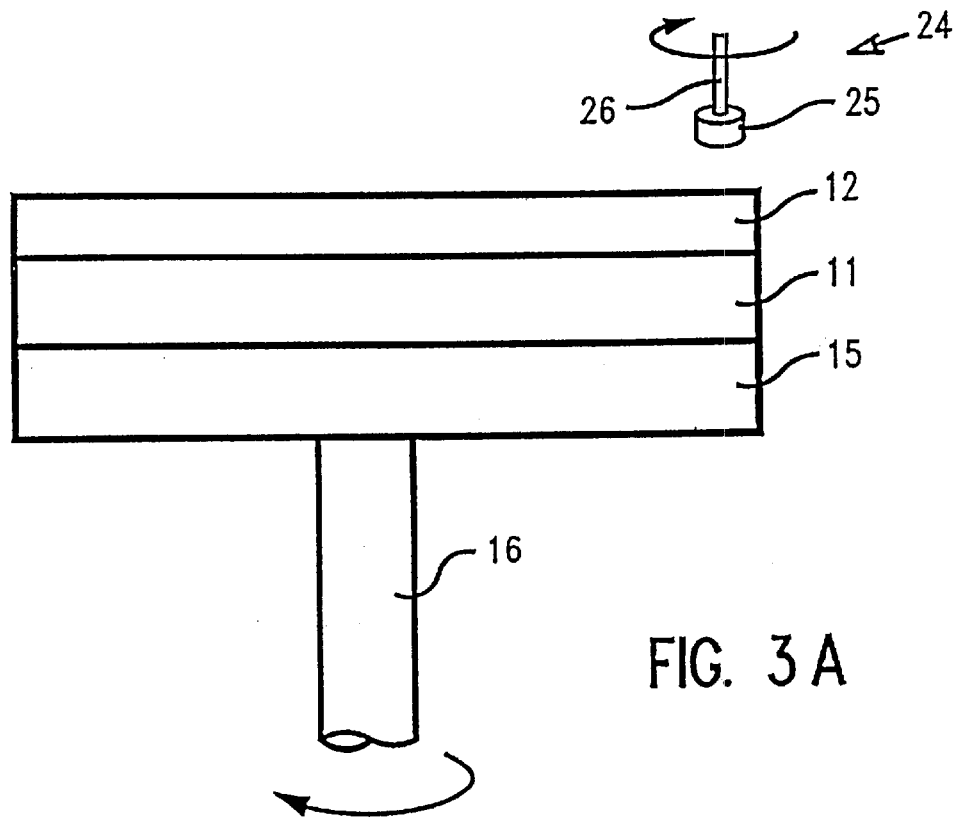
FIGS. 3A–3B show diagramatically the use of a polishing tool to form a profiled dielectric coated semiconductor wafer.
Figure 3B:
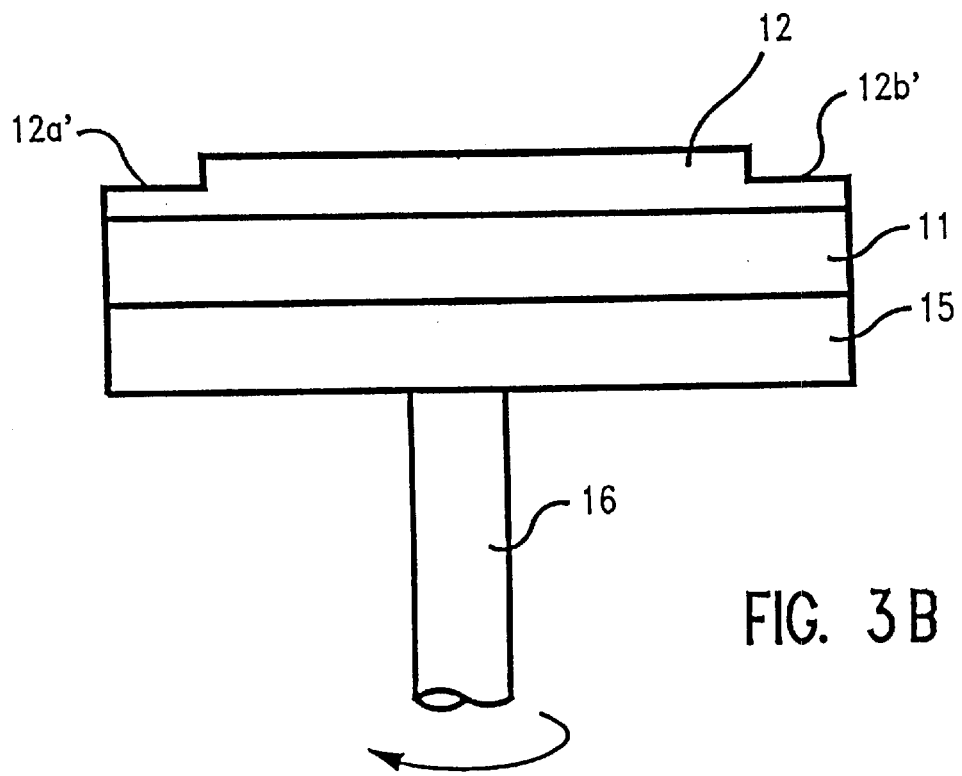

Referring to FIGS. 3A and 3B, another method of the invention to form a profiled dielectric layer on a semiconductor wafer is shown. A substrate 11 having a dielectric layer 12 is positioned on a turntable 15 which is rotated by a shaft 16. A polishing tool 24 is used to profile the dielectric layer 12 and the tool comprises a polishing wheel 25 and a rotating shaft 26. The tool 24 will be rotated and the polishing wheel 25 contacted with the dielectric layer 12 at the periphery of the layer to remove dielectric material from the edge of the dielectric layer. FIG. 3B shows removal of a peripheral portion of dielectric layer 12 forming thinner dielectric surfaces 12a' and 12b'. The substrate 11 and dielectric 12 have now been profiled and the profiled wafer would then be chemically mechanically polished using a CMP apparatus to form a planarized dielectric layer 12 as shown above in FIG. 1F. Shafts 16 and 26 may be parallel to each other as shown or at an angle to each other, e.g., perpendicular.

Figure 4A:
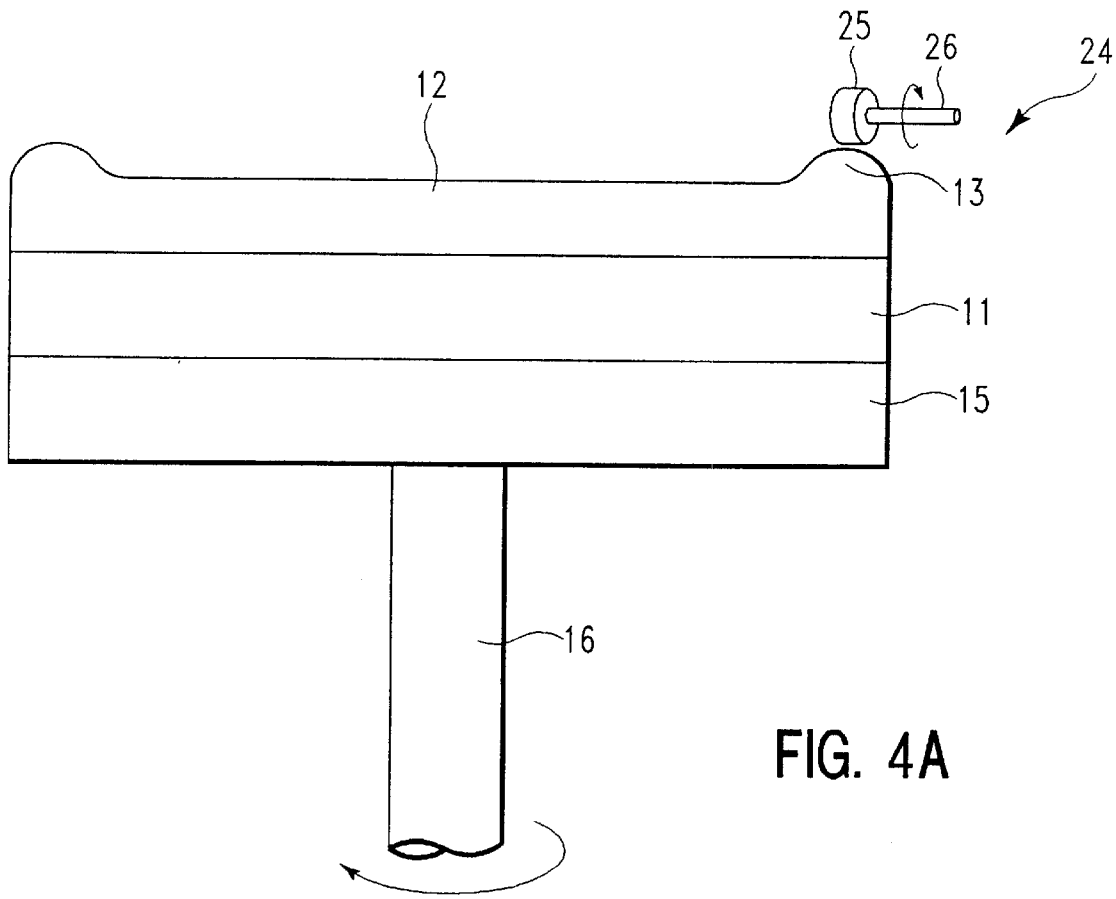
FIGS. 4A–4B show diagramatically the use of a polishing tool to remove the edge bead from a semiconductor wafer polished by CMP.
Figure 4B:
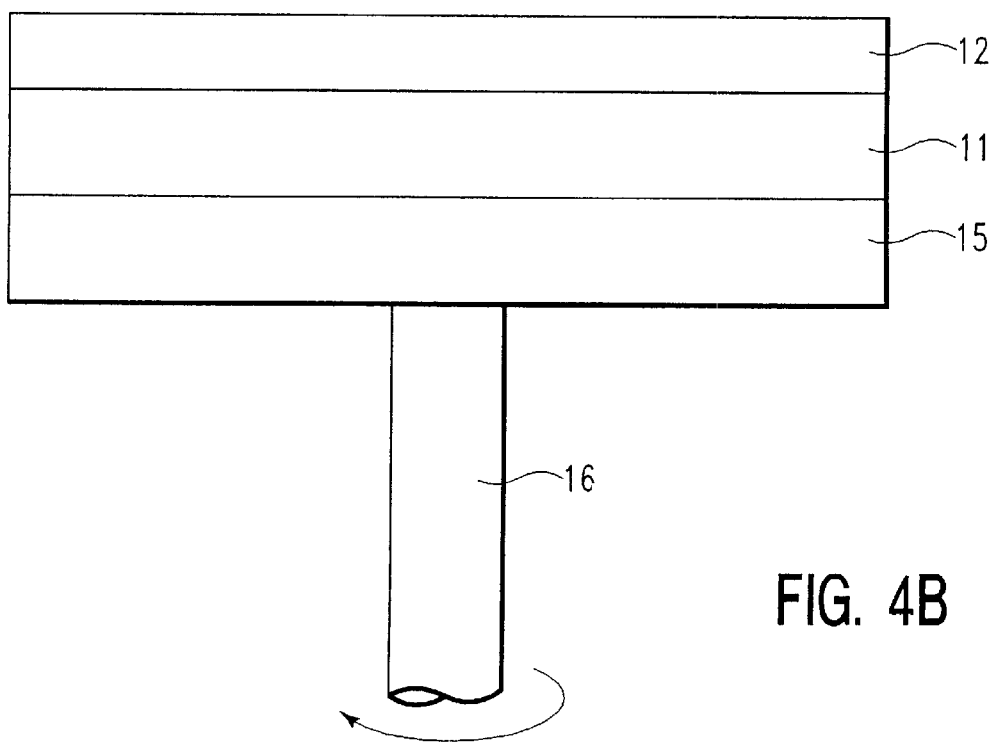

FIGS. 4A and 4B show another method of the invention to remove an edge bead from a dielectric layer of a semiconductor wafer which has been polished using a CMP process. A substrate 11 having a dielectric layer 12 thereon is positioned on a turntable 15 which is rotated by shaft 16. The dielectric layer 12 has edge beads 13 which were formed during the CMP process. A polishing tool 24 is used to remove the edge beads forming a planar dielectric surface 12 as shown in FIG. 4B. The polishing tool 24 comprises a polishing wheel 25 and a rotating vertical shaft 26. The polishing wheel 25 of the polishing tool is brought into contact with the peripheral edge bead of dielectric 12 and removes the edge bead 13. As in FIG. 3C, shafts 16 and 26 may be parallel to each other or angled to each other, e.g., perpendicular.

Figure 5:
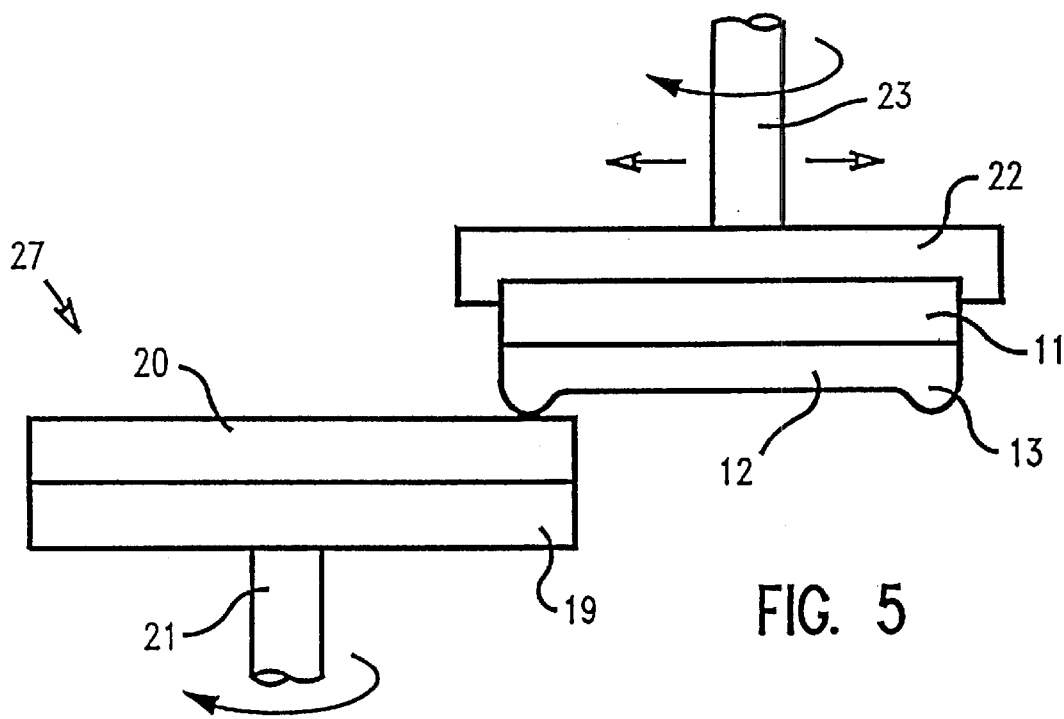
FIG. 5 shows diagramatically the use of a CMP device to remove the edge based from a semiconductor wafer polished by CMP.
Figure 6:
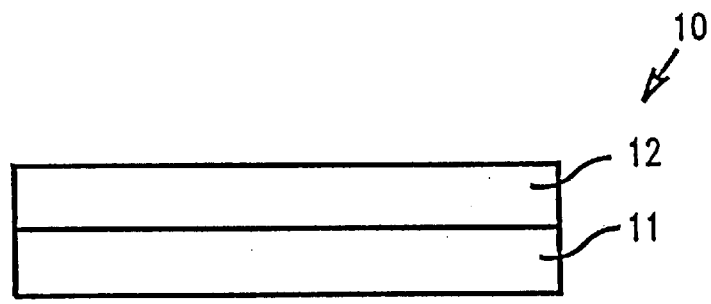
FIGS. 6A–6B shows the formation of an edge bead on a semiconductor wafer polished by conventional CMP processes.
Figure 6:
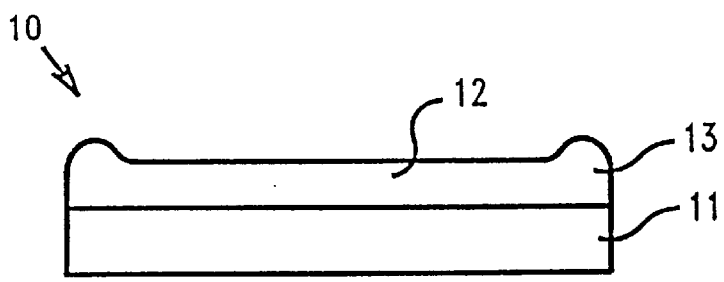

Another method to remove the edge bead of a dielectric layer of a semiconductor wafer which has been polished using a CMP process is shown in FIG. 5. A conventional CMP apparatus is shown generally as 27 and comprises a horizontal rotating turntable 19, a polishing pad 20 on the surface of the turntable and a vertical shaft 21 which turns the turntable and pad. A wafer carrier 22 rotated by a vertical shaft 23 is shown holding a substrate 11 having thereon a dielectric layer 12 having an edge bead 13. The wafer carrier 22 is moved as shown by the arrows or held stationary so that the edge bead 13 of the dielectric layer contacts the polishing pad 20 of the CMP apparatus 27. Preferably, only the edge bead 13 contacts the polishing pad 20 and the contacting is continued until the edge bead 13 is removed and the dielectric layer 12 planarized as shown above in FIG. 1F.

FIGS. 6A and 6B show how an edge bead is formed on a dielectric layer during polishing of a semiconductor wafer using a CMP process. A semiconductor wafer 10 having a substrate 11 and a dielectric layer 12 is shown in FIG. 6A. After CMP polishing, the dielectric layer 12 has a peripheral edge bead 13 as shown in FIG. 6B. It is this edge bead 13 which is removed or the formation of the edge bead avoided during fabrication processes for semiconductor devices by the method and apparatus of the invention.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention,

What is claimed is:

1. An apparatus for planarizing a dielectric layer on a semiconductor wafer comprising:

a rotating turntable, rotated by a first shaft, to which is secured a wafer having a diameter and a peripheral edge;

a rotating polishing wheel, rotated by a second shaft, having a diameter less than the diameter of the wafer, said first shaft at an angle to said second shaft such that said rotating polishing wheel rotates at an angle to said rotating turntable;

wherein the surface of the wafer is planarized or profiled to form a thinner dielectric peripheral portion by contacting the peripheral edge of the wafer with the polishing wheel.

2. The apparatus of claim 1 wherein the rotating wafer has a peripheral edge bead and the polishing wheel has a diameter less than the diameter of the peripheral edge bead on the surface of the wafer.

3. The apparatus of claim 1 wherein said first shaft is perpendicular to said second shaft such that the rotating polishing wheel rotates perpendicular to the rotating turntable.

* * * * *